United States Patent
Takezawa (10) Patent No.: US 12,158,708 B2
(45) Date of Patent: Dec. 3, 2024

(54) EXPOSURE HEAD AND IMAGE FORMING APPARATUS

(71) Applicant: CANON KABUSHIKI KAISHA, Tokyo (JP)

(72) Inventor: Satoru Takezawa, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 166 days.

(21) Appl. No.: 18/076,555

(22) Filed: Dec. 7, 2022

(65) Prior Publication Data
US 2023/0185213 A1 Jun. 15, 2023

(30) Foreign Application Priority Data
Dec. 13, 2021 (JP) .................. 2021-201843

(51) Int. Cl.
*G03G 15/04* (2006.01)
*H10K 59/95* (2023.01)

(52) U.S. Cl.
CPC . *G03G 15/04063* (2013.01); *G03G 15/04054* (2013.01); *H10K 59/95* (2023.02)

(58) Field of Classification Search
CPC ....... G03G 15/04054; G03G 15/04063; H10K 59/95
See application file for complete search history.

(56) References Cited

U.S. PATENT DOCUMENTS

| | | | |
|---|---|---|---|
| 2012/0195608 A1* | 8/2012 | Yokoi | B41J 2/45 399/51 |
| 2018/0309890 A1 | 10/2018 | Kondo | |
| 2022/0019153 A1* | 1/2022 | Sato | G03G 15/6529 |
| 2022/0128922 A1* | 4/2022 | Yagi | G03G 15/04054 |
| 2022/0197176 A1* | 6/2022 | Nakanishi | G03G 15/04054 |
| 2022/0404731 A1* | 12/2022 | Nomura | G03G 15/04054 |

FOREIGN PATENT DOCUMENTS

JP 2017-183436 A 10/2017

* cited by examiner

*Primary Examiner* — Sophia S Chen
(74) *Attorney, Agent, or Firm* — Venable LLP (57) ABSTRACT

An exposure head includes a first light emitting board group, a first lens array, a second light emitting board group, and a second lens array. The first light emitting board group is disposing a plurality of first light emitting boards each including a plurality of first light emitting elements disposed side by side in a second direction intersecting with the first direction. The plurality of first light emitting boards are disposed along the second direction and alternately in the first direction. The first lens array condenses light emitted from the plurality of first light emitting elements disposed on the first light emitting board group onto the surface of the image bearing member. The second light emitting board group is disposed in a manner separated with respect to the first light emitting board group in the first direction.

5 Claims, 8 Drawing Sheets

EXPOSURE HEAD AND IMAGE FORMING APPARATUS

BACKGROUND OF THE INVENTION

Field of the Invention

This disclosure relates to an exposure head applied to an image forming apparatus of such as an electrophotographic system which forms an image with a use of developer, and the image forming apparatus.

Description of the Related Art

Hitherto, in an image forming apparatus of such as a printer of an electrophotographic system, a system in which an exposure head using a light-emitting diode (LED) or an organic electroluminescence (EL) element is used for exposing a photosensitive drum so as to form a latent image is generally known. The exposure head, generally, includes a row of light emitting elements disposed side by side in a longitudinal direction of the photosensitive drum and a rod lens array condensing the light of the row of the light emitting elements onto the photosensitive drum. As a configuration of the LED and the organic EL element, a configuration having a surface emitting shape in which a light emitting direction and an optical axis of the rod lens array are the same is known.

Here, with respect to the longitudinal direction of the photosensitive drum, the length and an element interval (pitch) of the row of the light emitting elements are determined respectively depending on the width of an image area on the photosensitive drum and on the resolution of the printer. For example, in a case of a 1200 dots per inch (dpi) printer, since a pixel interval (pitch) is approximately 21.16 (disregarding beyond three decimal places) micrometer (μm), the element interval also becomes 21.16 μm. Since a smaller number of components are used in the printer using the exposure head described above in comparison with a printer of a laser scanning type deflecting a laser beam by a polygon motor for scanning, it is easy to miniaturize the apparatus and reduce the cost. Then, as such an exposure head, an exposure head using a thin film transistor (TFT) circuit and the organic EL element on a transparent glass substrate is suggested (refer to Japanese Patent Laid-Open No. 2017-183436). In this exposure head, the TFT circuit is formed on the transparent glass substrate, and, further on top of the TFT circuit, the organic EL light emitting layer is formed, so that light from the organic EL light emitting layer is extracted through the transparent glass substrate (refer to FIG. 6 in Japanese Patent Laid-Open No. 2017-183436).

However, since the light from the organic EL light emitting layer is extracted through the glass substrate in a case of the exposure head described in Japanese Patent Laid-Open No. 2017-183436, the light is obstructed by such as the wiring of the TFT circuit, and the use efficiency of the light is inefficient, so that the output of the exposure head is low Since the output of the organic EL element is low as described above, there is the fear that a light amount to a surface of the photosensitive drum might be insufficient for accommodating high-speed applications such as print on demand (POD).

The purpose of this disclosure is to provide an exposure head capable of achieving high output and an image forming apparatus.

SUMMARY OF THE INVENTION

According to a first aspect of the present invention, an exposure head configured to form an electrostatic latent image by exposing a charged surface of an image bearing member movable in a first direction, the exposure head includes a first light emitting board group disposing a plurality of first light emitting boards each including a plurality of first light emitting elements disposed side by side in a second direction intersecting with the first direction, the plurality of first light emitting boards being disposed along the second direction and alternately in the first direction, a first lens array configured to condense light emitted from the plurality of first light emitting elements disposed on the first light emitting board group onto the surface of the image bearing member, a second light emitting board group disposing a plurality of second light emitting boards each including a plurality of second light emitting elements disposed side by side in the second direction, the plurality of second light emitting boards being disposed along the second direction and alternately in the first direction, the second light emitting board group being disposed in a manner separated with respect to the first light emitting board group in the first direction, and a second lens array configured to condense light emitted from the plurality of second light emitting elements disposed on the second light emitting board group onto the surface of the image hearing member.

According to a second aspect of the present invention, an image forming apparatus includes an image bearing member, a charge unit configured to charge a surface of the image bearing member, the exposure head, a developing unit configured to develop an electrostatic latent image formed on the surface of the image bearing member by the exposure head with developer, and a transfer unit configured to transfer the developed image onto a recording material.

Further features of the present invention will become apparent from the following description of exemplary embodiments with reference to the attached drawings.

DESCRIPTION OF THE EMBODIMENTS

Hereinafter, with reference to FIGS. 1 to 8, the embodiment of this disclosure will be described in detail. In this embodiment, a tandem type full color printer using an electrophotographic system for forming an image on a recording material will be described as an example of an image forming apparatus 1. To be noted, as the image forming apparatus 1, it is not limited to the tandem type disposing a plurality of image forming units side by side, and a rotary type disposing the plurality of image forming units cylindrically is also acceptable. Further, it is not limited to a direct transfer system directly transferring a toner image from a photosensitive member onto a sheet S that is a recording medium, and an intermediate transfer system secondarily transferring the toner image onto the sheet S after a primary transfer onto an intermediate transfer member is also acceptable. Further, it is also not limited to a full color, and monochrome and a mono-color are also acceptable. The recording medium is the sheet S, and includes, other than standard paper, special paper such as coated paper, a recording material of a special shape such as an envelope and an index sheet, a plastic film for an overhead projector, cloth, and the like.

Image Forming Apparatus

Figure 1:
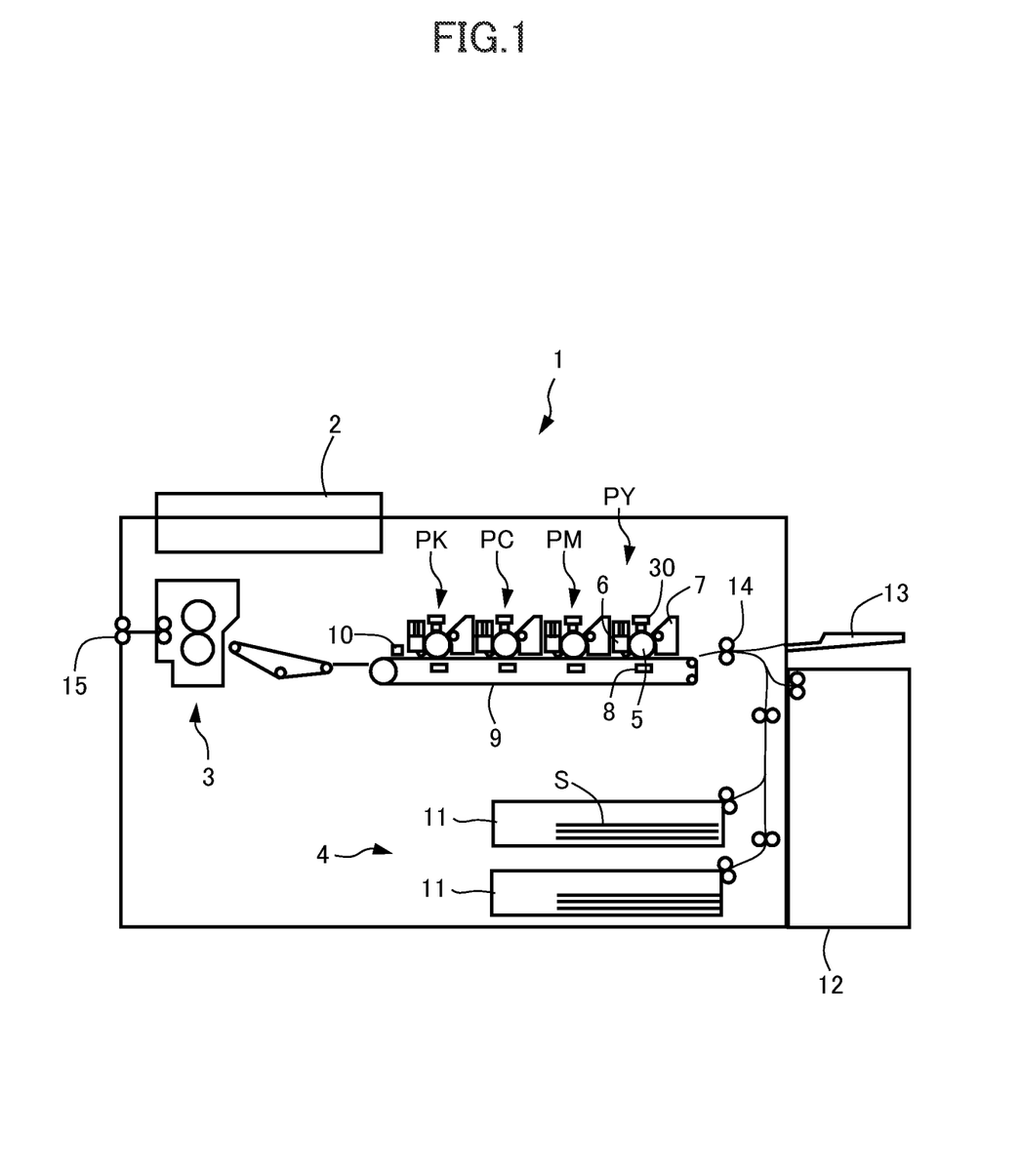
FIG. 1 is a cross-sectional view showing a schematic configuration of an image forming apparatus relating to an embodiment.

FIG. 1 shows a configuration of the image forming apparatus 1. The image forming apparatus 1 includes a scanner 2, image forming units PC, PM, PY, and PK, a fixing unit 3, a sheet feed unit 4, and a control unit, not shown, controlling these. The scanner 2 optically reads a document image by emitting light onto a document placed on a document table, and creates image data by converting the image to an electrical signal.

The image forming unit PC forms a cyan image by using a cyan toner. The image forming unit PM forms a magenta image by using a magenta toner. The image forming unit PY forms a yellow image by using a yellow toner. The image forming unit PK forms a black image by using a black toner Since the image forming units PC, PM, PY, and PK are basically similar to each other in a configuration except for colors of accommodated toners, hereinafter, the configurations and image firming processes of the image forming units will be described using the image forming unit PY as an example.

In each of the image forming units PC, PM, PY and PK, a movable photosensitive drum 5 which is an example of an image bearing member is rotatably driven, and a surface of the photosensitive drum 5 is charged by a charge unit 6 which is an example of a charge unit. An exposure head 30 emits the light depending on the image data, and forms an electrostatic latent image. The details of the exposure head 30 will be described below A developing unit 7 which is an example of a developing unit develops the electrostatic latent image formed on the surface of the photosensitive drum 5 by the exposure head 30 with developer (toner). A transfer unit 8 transfers the developed toner image onto the sheet S conveyed onto a transfer belt 9.

Each of the image forming units PC, PM, PY, and PK performs a series of electrophotographic processes (charge, exposure, development, transfer), and forms the image of the full color by superimposing the images in order of cyan (C), magenta (M), yellow (Y), and black (K). Each of the image forming units PM, PY, and PK sequentially performs an image forming operation when a predetermined time elapses after the image forming unit PC starts the image forming operation.

An optical sensor 10 is disposed at a position facing the transfer belt 9, and detects a position of a test chart formed on the transfer belt 9 so as to derive amounts of color shifts between the image forming units PC, PM, PY, and PK. The amounts of the color shifts derived here are notified to an image control unit, not shown, and the image position of each color is corrected. By this control, a full color toner image without the color shift is transferred onto the sheet S.

A built-in sheet feed unit 11, an external sheet feed unit 12, and a manual sheet feed unit 13 are disposed in the image forming apparatus 1. The sheet feed unit 4 feeds the sheet S from the sheet feed unit 11, 12, or 13 predetermined beforehand among the sheet feed units 11, 12, and 13, and conveys the sheet S to a registration roller 14. The registration roller 14 conveys the sheet S onto the transfer belt 9 in the titling when the toner images formed in the image forming units PC, PM, PY, and PK are transferred onto the sheet S.

The fixing unit 3, including a combination of rollers and incorporating a heat source such as a halogen lamp, melts and fixes the toner on the sheet S, onto which the toner has been transferred from the transfer belt 9, by heat and pressure, and discharges the sheet S outside of the image forming apparatus 1 by a sheet discharge roller 15. The control unit communicates with a multifunction peripheral (MFP) control unit controlling the whole of the MFP, and performs control in accordance with an instruction of the MFP control unit. While managing a state of each of the scanner 2, the image forming units PC, PM, PY, and PK, the fixing unit 3, and the sheet feed unit 4, the control unit provides instructions so as to achieve a smooth operation maintaining harmony as the whole.

Overview of Exposure Head

Figure 2A:
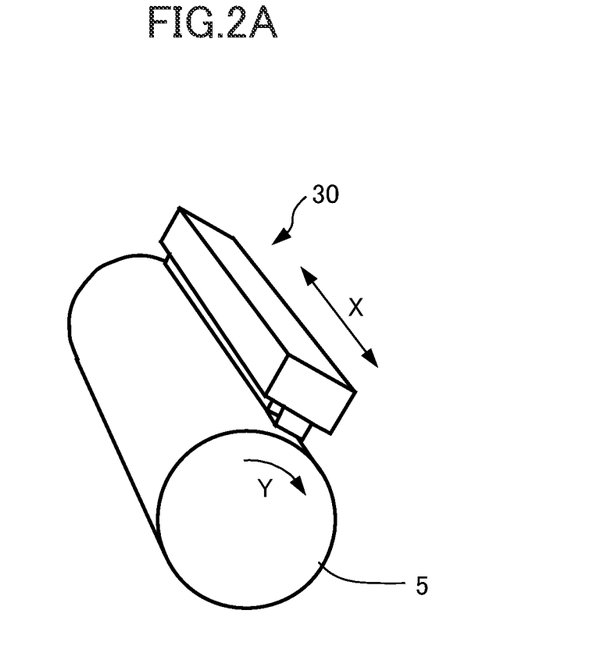
FIG. 2A is a perspective view showing a peripheral configuration of an exposure head relating to the embodiment.
Figure 2B:
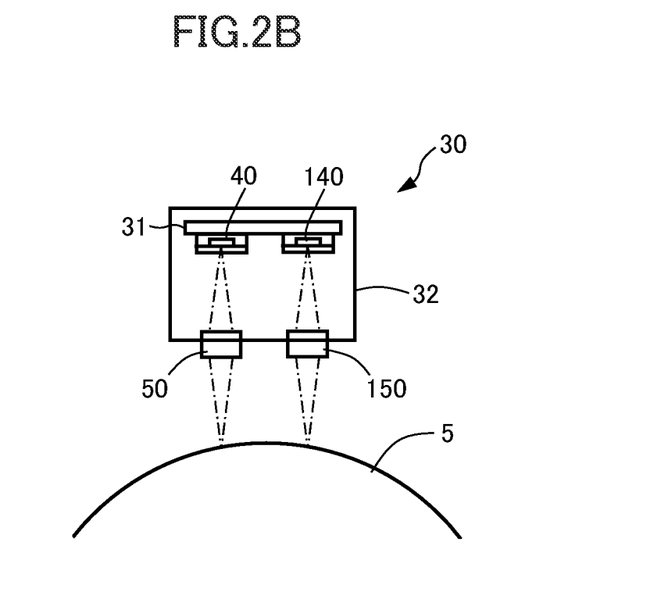
FIG. 2B is a cross-sectional view showing the peripheral configuration of the exposure head relating to the embodiment.

Next, an overview of the exposure head 30 performing the exposure of the photosensitive drum 5 will be described using FIGS. 2A and 2B, FIG. 2A shows a disposition of the exposure head 30 with respect to the photosensitive drum 5. The photosensitive drum 5 and the exposure head 30 are disposed in a manner longitudinally parallel to each other and in a manner facing each other. In this embodiment, a rotation direction (moving direction) of the photosensitive drum 5 is referred to as a Y direction, serving as a first direction, and a direction intersecting (in this embodiment, orthogonally intersecting) with the Y direction is referred to as an X direction, serving as a second direction. That is, the X direction is a main scanning direction, and the Y direction is a sub-scanning direction.

FIG. 2B shows a cross-sectional view of the exposure head 30. The exposure head 30 includes a printed circuit board 31, a first light emitting element group 40 and a second light emitting element group 140 disposed on the printed circuit board 31, a first rod lens array 50 and a second rod lens array 150, and a housing 32 to which these are provided. In this embodiment, two rows each of the light emitting element groups 40 and 140 and the rod lens arrays 50 and 150 are disposed in parallel to each other in the Y direction, and the X direction is the longitudinal directions of the light emitting element groups 40 and 140 and the rod lens arrays 50 and 150.

The light emitted from the light emitting element groups 40 and 140 is condensed onto the photosensitive drum 5 by the rod lens arrays 50 and 150. Each of the exposure head 30 and the photosensitive drum 5 is mourned to the image forming apparatus 1 by a mounting member, not shown. To be noted, while, in this embodiment, a case where the rod lens arrays 50 and 150 are used as a lens is described, it is not limited to this, and a lens of other configurations is also acceptable.

The photosensitive drum 5, the first rod lens array 50, and the first light emitting element group 40 are disposed such that a distance between the photosensitive drum 5 and the first rod lens array 50 and a distance between the first rod lens array 50 and the first light emitting element group 40 become respective predetermined intervals. Similarly, the photosensitive drum 5, the second rod lens array 150, and the second light emitting element group 140 are disposed such that a distance between the photosensitive drum 5 and the second rod lens array 150 and a distance between the second rod lens array 150 and the second light emitting element group 140 become respective predetermined intervals. Thereby, the light emitted from the first light emitting element group 40 is focused on the photosensitive drum 5 via the first rod lens array 50, and the light emitted from the second light emitting element group 140 is focused on the photosensitive drum 5 via the second rod lens array 150.

At the time of assembling the exposure head 30 in a factory, assembly adjustment work is performed on the exposure head 30 as a single unit, and focus adjustment and light amount adjustment so as to adjust the size of a spot at a focal position to a predetermined size are performed. Therefore, at the time of the focus adjustment, installation positions of the rod lens arrays 50 and 150 are adjusted such that the distances between the rod lens arrays 50 and 150 and the light emitting element groups 40 and 140 become a desired value. Further, at the time of the light amount adjustment, a drive current of each light emitting element is adjusted such that, by sequentially causing each of the light emitting elements to emit the light, the light amount of the condensed light via the rod lens arrays 50 and 150 becomes a predetermined light amount. As described above, the exposure head 30 emits the light depending on the image data, and forms the electrostatic latent image by condensing the light emitted on chip surfaces of the light emitting element groups 40 and 140 onto the photosensitive drum 5 with the rod lens arrays 50 and 150.

Configuration of Exposure Head

Figure 3A:
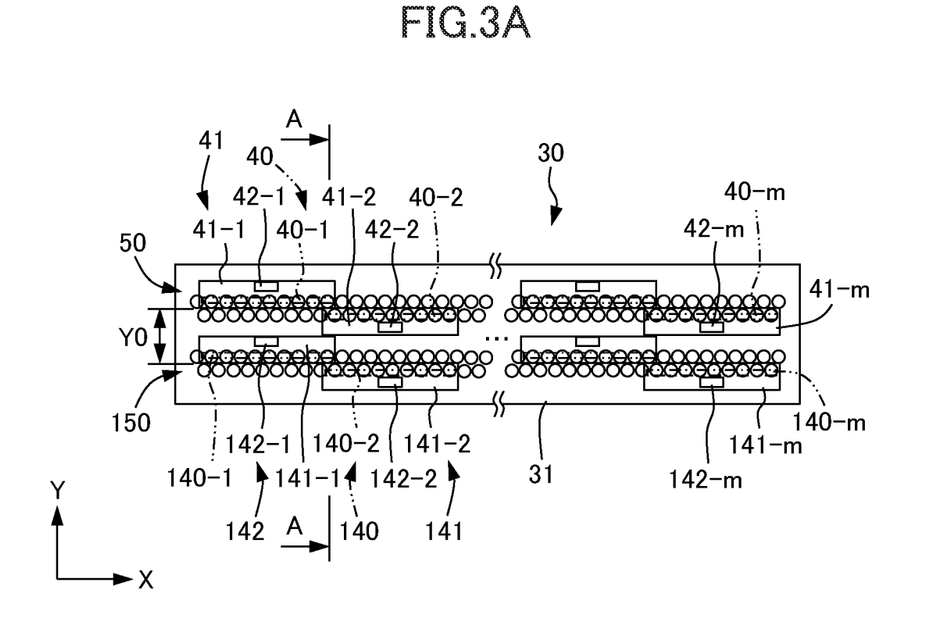
FIG. 3A is a plan view showing a configuration of the exposure head relating to the embodiment.

Next, a detailed configuration of the exposure head 30 will be described using FIGS. 3A and 3B. FIG. 3A is a schematic plan view of the exposure head 30. The printed circuit board 31 is, in this embodiment, for example, a general glass epoxy printed circuit board. In the printed circuit board 31, a first light emitting board group 41 and a second light emitting board group 141, disposed in a manner separated from the first light emitting board group 41 in the Y direction, are disposed.

The first light emitting board group 41 includes an aggregate of first light emitting boards 41-1, 41-2, . . . , and 41-m which are, for example, transparent glass boards on which a thin film transistor (TFT) is formed. In this embodiment, the first light emitting board group 41 is the aggregate of m pieces, and m can be set appropriately. The first light emitting element group 40 includes an aggregate of first light emitting bodies 40-1, . . . , and 40-m. The first light emitting bodies 40-1, 40-2, . . . , and 40-m are respectively disposed on the first light emitting boards 41-1, 41-2, . . . , and 41-m. First driver integrated circuits (ICs) 42-1, 42-2, . . . , and 42-m for driving the first light emitting bodies 40-1, 40-2, . . . , and 40-m are disposed on the first light emitting boards 41-1, 41-2, . . . , and 41-m. In this embodiment, in the first light emitting board group 41, the plurality of first light emitting boards 41-1, 41-2, . . . , and 41-m are disposed along the X direction and alternately in a zigzag pattern in the Y direction.

Similarly, the second light emitting board group 141 includes an aggregate of second light emitting boards 141-1, 141-2, . . . , and 141-m which are, for example, the transparent glass boards on which the TFT is formed. The second light emitting element group 140 includes an aggregate of second light emitting bodies 140-1, 140-2, . . . , and 140-m. The second light emitting bodies 140-1, 140-2, . . . , and 140-m are respectively disposed on the second light emitting boards 141-1, 141-2, . . . , and 141-m. Second driver ICs 142-1, 142-2, . . . , and 142-m for driving the second light emitting bodies 140-1, 140-2, . . . , and 140-m are disposed on the second light emitting boards 141-1, 141-2, . . . , and 141-m. In this embodiment, in the second light emitting board group 141, the plurality of second light emitting boards 141-1, 141-2, . . . , and 141-m are disposed along the X direction and alternately in the zigzag pattern in the Y direction.

Figure 3B:
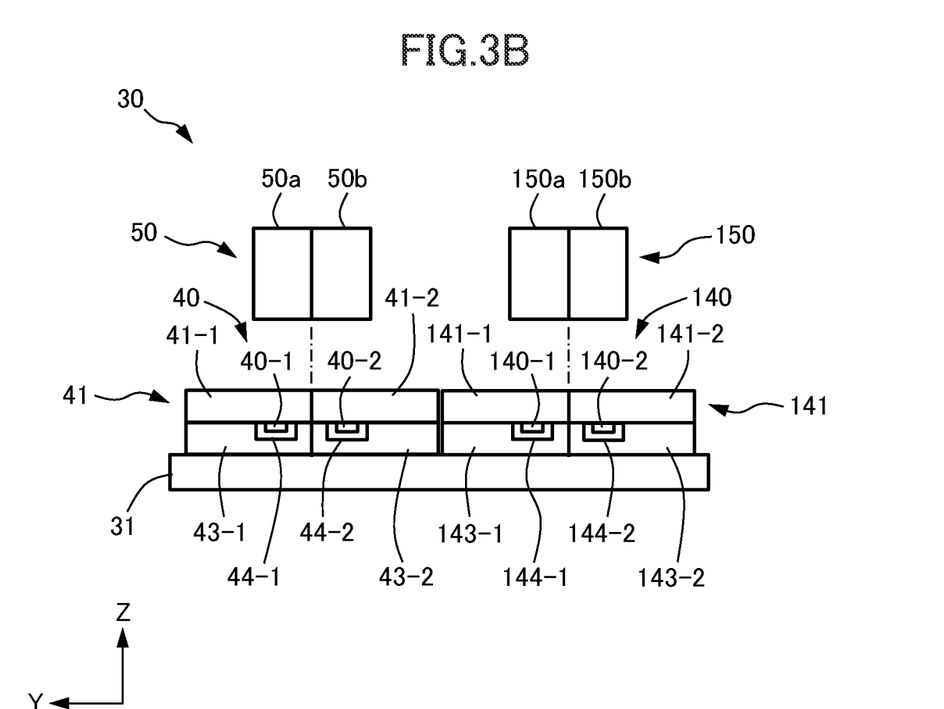
FIG. 3B is a cross-sectional view showing the configuration of the exposure head relating to the embodiment taken along the line A-A.

FIG. 3B is a cross-sectional view taken along the line A-A in FIG. 3A, and a Z direction in FIG. 3B shows an optical axis direction. For example, the first light emitting bodies 40-1 is disposed on the first light emitting board 41-1 in a manner facing the printed circuit board 31. Further, a first sealing board 43-1 for sealing the first light emitting body 40-1 is interposed between the first light emitting board 41-1 and the printed circuit board 31. In this embodiment, an organic electroluminescence (EL) element is used as the first light emitting body 40-1. Since the organic EL element is weak against moisture, the first light emitting body 40-1 is isolated from outer air by forming a sealed space 44-1 in the first sealing board 43-1 in such a manner that the first light emitting body 40-1 is included in the first sealing board 43-1. Similarly, also in other places, a first sealing board 43-2 and second sealing boards 143-1 and 143-2 are interposed between the light emitting board and the printed circuit board 31, and the light emitting bodies are isolated from the outer air by forming sealed spaces 44-2, 144-1, and 144-2.

The first rod lens array 50 includes a first side part 50a and a second side part 50b, which are two rows of rod lenses disposed side by side in the Y direction, and the first and second side parts 50a and 50b respectively face the first light emitting bodies 40-1 and 40-2. It is preferred that the first light emitting bodies 40-1 and 40-2 and the first rod lens array 50 are disposed such that the center of the first light emitting bodies 40-1 and 40-2 in the Y direction coincides with the center of the first rod lens array 50 in the Y direction. Similarly, the second rod lens array 150 includes a first side part 150a and a second side part 150b, which are two rows of rod lenses disposed side by side in the Y direction, and the first and second side parts 150a and 150b respectively face the second light emitting bodies 140-1 and 140-2. It is preferred that the second light emitting bodies 140-1 and 140-2 and the second rod lens array 150 are disposed such that the center of the second light emitting bodies 140-1 and 140-2 in the Y direction coincides with the center of the second rod lens array 150 in the Y direction. To be noted, each of the rod lens arrays 50 and 150 is fixed to brackets, not shown, with an adhesive, and a distance between each of the rod lens arrays 50 and 150 and each of the light emitting element groups 40 and 140 is adjusted so that a diameter of the spot at the focal position on the photosensitive drum 5 becomes appropriate.

Rod Lens Array

Figure 4:
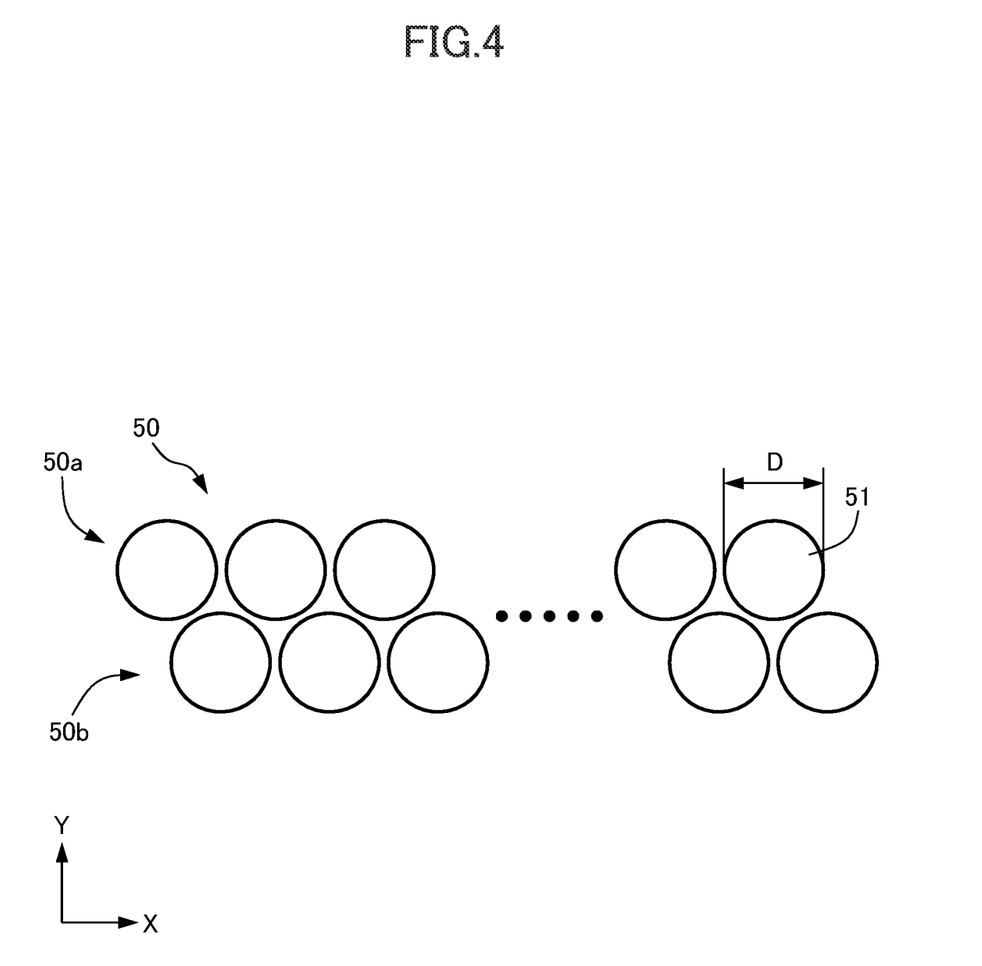
FIG. 4 is a plan view showing a first rod lens array relating to the embodiment.

The first rod lens array 50 includes a SELFOC (registered trademark) lens array in which two rows of SELFOC lenses disposed side by side in the Y direction are integrated with each other. Similarly, the second rod lens array 150 also includes the SELFOC lens array in which two rows of the SELFOC lenses disposed side by side in the Y direction are integrated with each other. The first and second rod lens arrays 50 and 150 are disposed in substantially parallel to each other in the Y direction. The first rod lens array 50 is an example of a first lens array, and the second rod lens array 150 is an example of a second lens array. Since the first and second rod lens arrays 50 and 150 are similar to each other in a configuration, hereinafter, the first rod lens array 50 will be described as a representative.

The first rod lens array 50 will be described using FIG. 4. FIG. 4 is a schematic plan view showing the first rod lens array 50. As shown in FIG. 4, the first rod lens array 50 is configured such that rod lenses 51 having a diameter D are two-dimensionally disposed in the Y and X directions. In a case where the diameter D of the rod lens 51 is large, while such a rod lens advantageously increases light utilization efficiency and reduces the light amount required for the light emitting element, on the other hand, a focal depth becomes shallow, and a focal position becomes likely to be displaced. Further, since the shape of the spot of the condensed light is likely to be worsened due to an increase in a lens aberration, there is a problem of reduction in an image quality. On the other hand case where the diameter D is small, the focal depth becomes deep, and the focal position becomes hardly displaced. Further, while the shape of the spot is satisfactory and it is possible to obtain a sharp image, there is a problem that the light amount is likely to become insufficient due to decrease in the light utilization efficiency.

Therefore, in this embodiment, while suppressing the reduction in the image quality, a sufficient light amount is secured by not increasing the diameter D but by increasing a number of the light emitting element groups and the rod lenses in the Y direction. In this embodiment, the two rows (the first and second side parts 50a and 50b) of the rod lenses 51 having the diameter D of 270 μm are disposed in the Y direction as the first rod lens array 50. To be noted, the second rod lens array 150 is similar to the first rod lens array 50.

Configuration of Light Emitting Element Group

Figure 5:
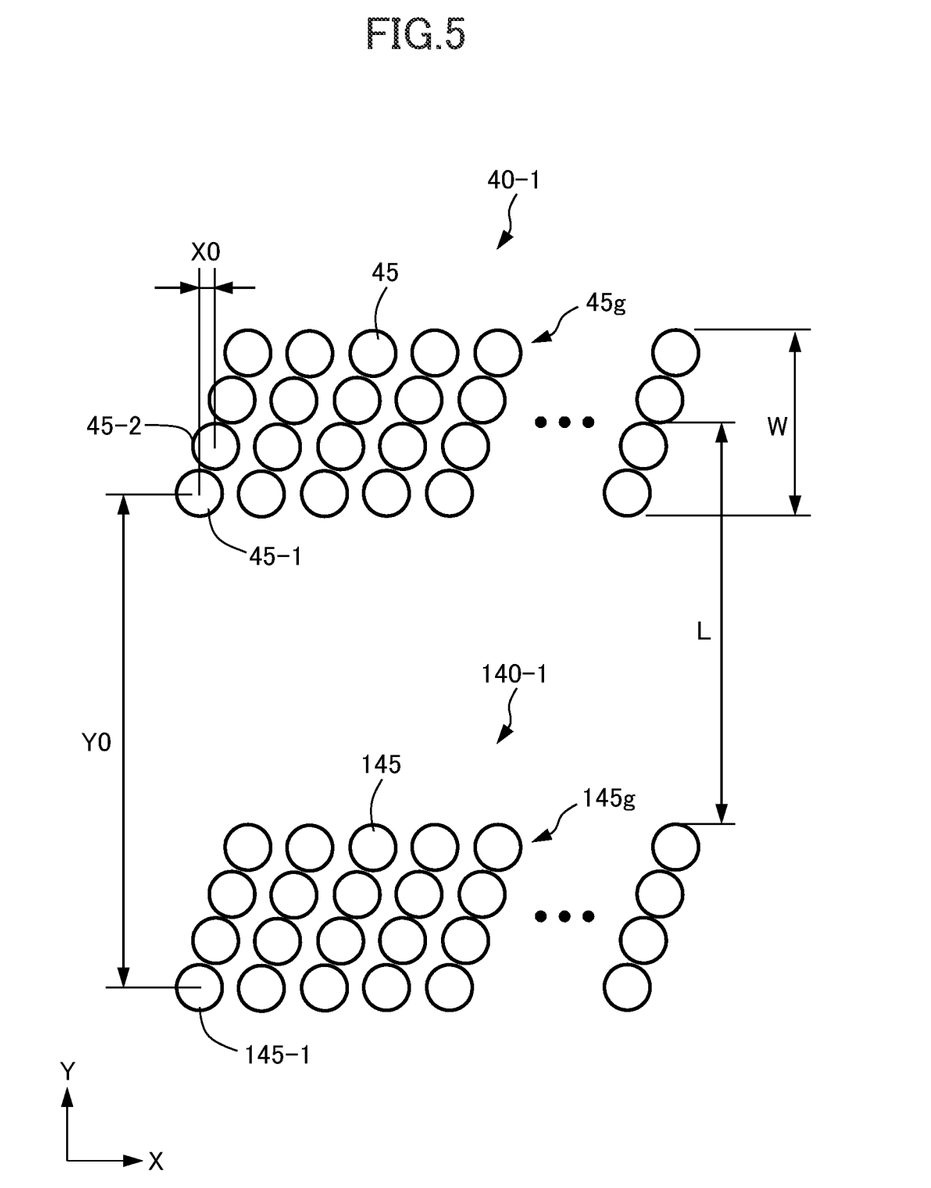
FIG. 5 is a plan view showing a first light emitting body and a second light emitting body relating to the embodiment.

FIG. 5 shows enlarged views of the first and second light emitting bodies 40-1 and 140-1. As shown in FIG. 5, the first and second light emitting bodies 40-1 and 140-1 are configured by respectively disposing a plurality of light emitting elements 45 and a plurality of light emitting elements 145 side by side in the X and Y directions. That is, each of the plurality of first light emitting elements 45 and the plurality of second light emitting elements 145 is disposed side by side in the X and Y directions. More particularly, the plurality of first light emitting elements 45 form a plurality of first groups 45g in each of which a predetermined number (for example, four pieces) of the first light emitting elements 45 are disposed linearly. The plurality of first groups 45g are disposed such that longitudinal directions of the plurality of first groups 45g disposed linearly are inclined with respect to the X and Y directions and parallel to each other. The plurality of second light emitting elements 145 form a plurality of second groups 145g in each of which a predetermined number (for example, four pieces) of the second light emitting elements 145 are disposed linearly. The plurality of second groups 145g are disposed such that longitudinal directions of the plurality of second groups 145g disposed linearly are inclined with respect to the X and Y directions and parallel to each other. In this embodiment, the first and second light emitting elements 45 and 145 are in a shape of a circle with a diameter of 60 μm. The shapes of the first and second light emitting elements 45 and 145 are not limited to the circle, and, for example, an oval and a polygon such as a rectangle and a hexagon can be used. In this embodiment, four pieces each of the light emitting elements 45 and 145 are disposed side by side in the Y direction, and width W in the Y direction is 240 μm. Further, a number of the first light emitting elements 45 in each of the first groups 45g is not limited to the plural (for example, four in this embodiment), and a single first light emitting element 45 in each of the first groups 45g is also acceptable. It is also the same for the second light emitting elements 145 in the second group 145g. In these cases, it is acceptable to use the first and second light emitting elements 45 and 145 of rectangular and oval shapes in which length in the Y direction is enlarged with respect to length in the X direction.

In this embodiment, the light emitting elements 45 and 145 adjacent to each other in the Y direction are disposed such that a shift distance in the X direction between each of the light emitting elements 45 and 145 is a distance corresponding to resolution in the main scanning direction. For example, regarding the light emitting elements 45-1 and 45-2, a distance X0 in the X direction between each of the centers of the light emitting elements 45-1 and 45-2 is 21.16 micrometer (μm) corresponding to 1200 dots per inch (dpi). It is also the same for the other light emitting elements 45 and 145.

Hereinafter, it is supposed that the light emitting elements 145-1 and 45-1 are respectively on an upstream and a downstream side with respect to the Y direction which is also the rotation direction of the photosensitive drum 5. In this case, if the light emitting element 45-1 is caused to emit the light after a predetermined time Δt after the light emitting element 145-1 has emitted the light and exposed a predetermined area of the photosensitive drum 5, it is possible to expose the same place that has been exposed by the light emitting element 145-1. That is, it is possible to expose the photosensitive drum 5 by twice the individual light amounts of the light emitting elements 45-1 and 145-1.

Given that a distance in the Y direction between the centers of the light emitting elements 145-1 and 45-1 and a process speed are respectively Y0 and v as shown in FIG. 5, a difference Δt in light emitting timing between the light emitting elements 145-1 and 45-1 can be calculated by an equation 1.

$$\Delta t = Y0/v \quad \text{(Equation 1)}$$

In this embodiment, when the distance Y0 and the process speed v are respectively, for example, 480 μm and 600 millimeter/second (mm/s), Δt is 0.8 milliseconds (ms) from the equation 1. Therefore, by causing the light emitting element 45-1 to emit the light after 0.8 millisecond (ms) after timing caused the light emitting element 145-1 to emit the light, it is possible to expose the same place on the photosensitive drum 5 by using the light emitting elements 145-1 and 45-1. As described above, by increasing the light emitting elements in the Y direction, it is possible to obtain the sufficient light amount by multiple exposure.

Width of Light Emitting Body in Sub-Scanning Direction

Figure 6:
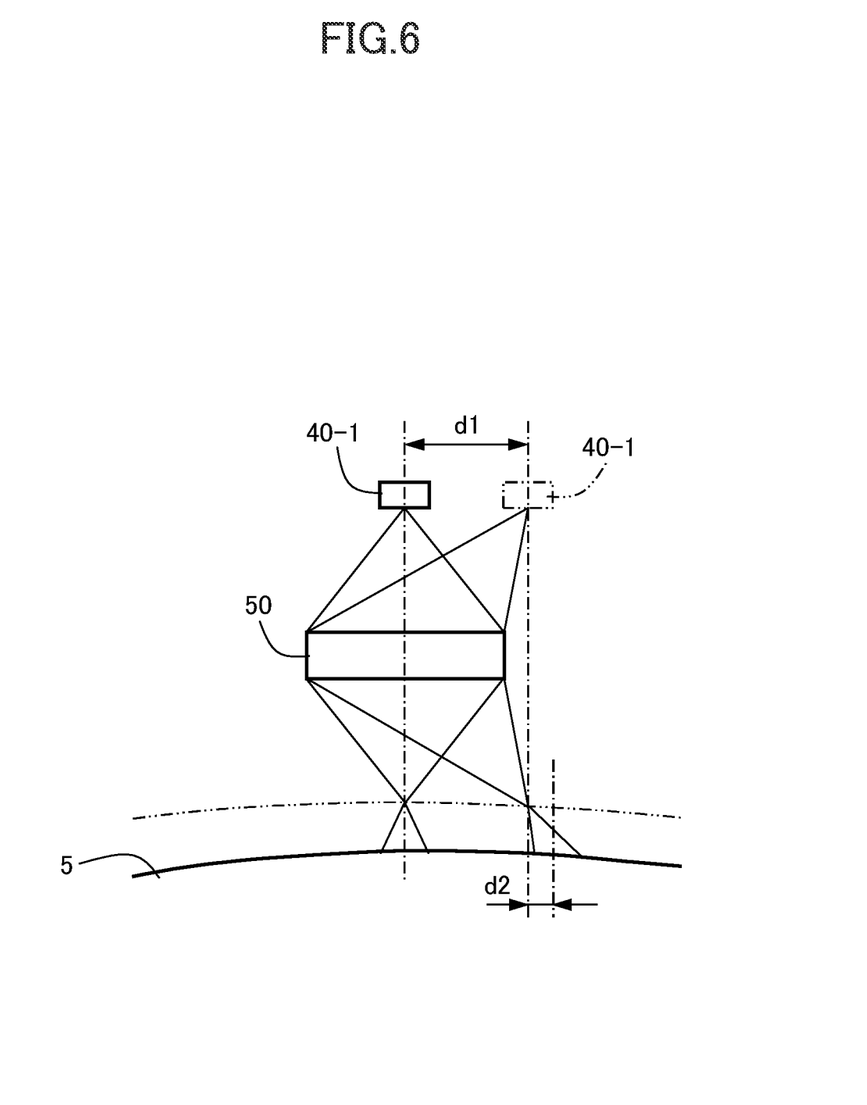
FIG. 6 is a cross-sectional view showing a relationship between the first light emitting body and the first rod lens array relating to the embodiment.

On the other hand, if the width of the light emitting bodies 40-1 and 140-1 in the Y direction is increased, there is the fear that harmful effects might arise. FIG. 6 is a schematic diagram showing a state where the focal position is displaced. In FIG. 6, the first light emitting body 40-1 at a position of a solid line is compared with the first light emitting body 40-1 at a position of a two-dot dash line. Since the center lines of the first light emitting body 40-1 at the position of the solid line and the first rod lens array 50 coincide with each other, positional displacement does not occur on the surface of the photosensitive drum 5. On the other hand, since the center line of the first light emitting body 40-1 at the position of the two-dot dash line is displaced by a distance d1 from the center line of the first rod lens array 50, the positional displacement of a distance d2 is generated on the surface of the photosensitive drum 5.

Figure 7A:
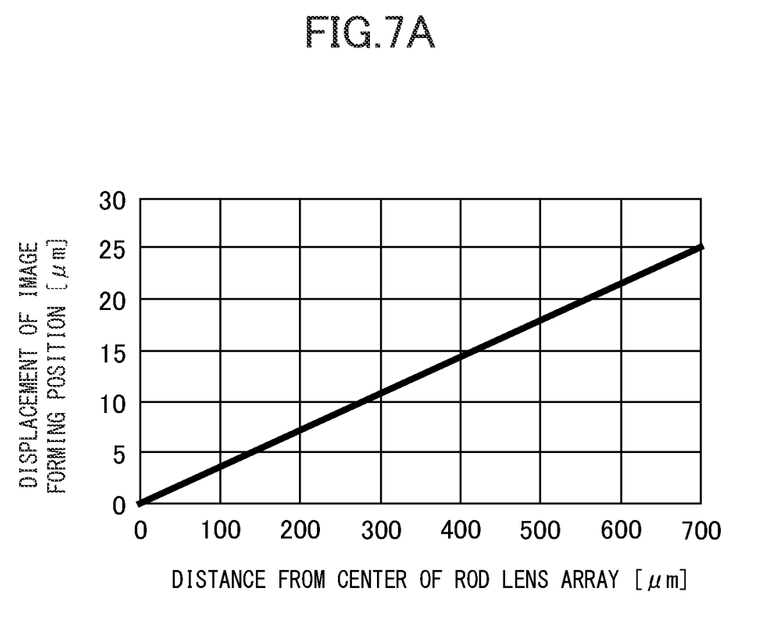
FIG. 7A is a graph showing a relationship between a distance, between a light emitting element and a rod lens array relating to the embodiment, and the displacement of an image forming position.

In a case where the focal position is displaced as shown in FIG. 6, if a distance between the centers of the first light emitting bodies 40-1 and the first rod lens array 50 is increased, an image forming position on the photosensitive drum 5 is greatly displaced. FIG. 7A is a graph showing a relationship between a distance between the center of the first rod lens array 50 and a light source and a displacement amount from a reference position of the image forming position on the photosensitive drum 5 in the case where the focal position is displaced, and shows a value in a case Where the focal position is displaced by 100 μm. As shown in FIG. 7A, since the light emitting element is separated from the center of the first rod lens array 50 along with an increase in the width W, the displacement from the reference position of the image forming position on the photosensitive drum 5 is increased.

Figure 7B:
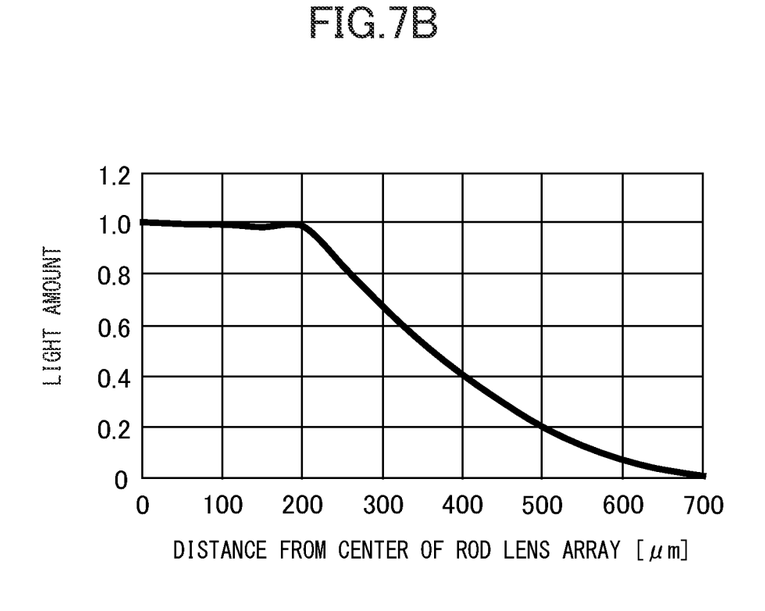
FIG. 7B is a graph showing a relationship between the distance, between the light emitting element and the rod lens array relating to the embodiment, and a light amount.

Further, if the width W ifs the Y direction shown in FIG. 5 is increased, there is the fear that other problems might arise. FIG. 7B shows a relationship between the distance between the center of the first rod lens array 50 and the light emitting element and the light amount for forming the image on the photosensitive drum 5. The light amount for forming the image on the photosensitive drum 5 is normalized using a value obtained at the time when the distance between the light emitting element and the center of the first rod lens array 50 is zero. As shown in FIG. 7B, when the light emitting element is separated from the center of the First rod lens array 50, the light amount for forming the image on the photosensitive drum 5 is decreased. Therefore, in a configuration having optical characteristics such as this embodiment, it is preferred that the first rod lens array 50 is disposed apart by a distance of equal to or less than 200 μm from the center of the first light emitting element group 40 in the Y direction. Similarly, it is preferred that the second rod lens array 150 is disposed apart by a distance of equal to or less than 200 μm from the center of the second light emitting element group 140 in the Y direction.

As shown in FIGS. 7A and 7B, when the width W of the light emitting element groups 40 and 140 in the Y direction is increased, there is the fear that problems of the displacement of the image forming position on the photosensitive drum 5 and the decrease in the light amount might occur. Therefore, it is preferred to obtain the light amount while suppressing the width W of the light emitting element groups 40 and 140 in the Y direction to a certain extent.

Interval in Sub-Scanning Direction

Further, the distance Y0 (pitch) in the Y direction between the light emitting bodies 40-1 and 140-1 adjacent to each other in the Y direction will be described using FIG. 5. Since, if the distance Y0 (pitch) in the Y direction between the pluralities of light emitting bodies 40-1 and 140-1 becomes too close, the light might enter into the adjacent rod lens arrays 50 and 150 and form the image on the photosensitive drum 5, there is the fear that image density might become different from the image density in other positions in the X direction. This is such a case where, for example, in FIG. 3B, the light emitted from the first light emitting element group 40 forms the image on the photosensitive drum 5 via the second rod lens array 150. Therefore, it is necessary to increase the distance Y0 in the Y direction between the light emitting element groups 40 and 140 to the extent where this kind of the problem does not occur.

As shown in FIG. 5, a distance in the Y direction between a light emitting element edge, that is closest to the first light emitting bodies 40-1 adjacent to the second light emitting bodies 140-1, of the second light emitting bodies 140-1 and the center of the adjacent first light emitting bodies 40-1 in the Y direction is referred to as a distance L. Since the light amount decreases when the light source is separated from the centers of the rod lens arrays 50 and 150, it is necessary to increase the distance L so as to sufficiently decrease this light amount. As shown in FIG. 7B, since the light amount is decreased to approximately 20% when the light source is separated by approximately 500 μm from the first rod lens array 50 and to nearly zero when the light source is separated by equal to or more than approximately 700 μm from the first rod lens array 50, the distance L is preferably equal to or more than 500 μm, and more preferably equal to or more than 700 μm.

That is, the distance in the Y direction between the first light emitting board group 41 and the second rod lens array 150 is set such that equal to or less than 20% of the light amount emitted from the first light emitting element group 40 enters into the second rod lens array 150. Further, a distance in the Y direction between the second light emitting board group 141 and the first rod lens array 50 is set such that equal to or less than 20% of the light amount emitted from the second light emitting element group 140 enters into the first rod lens array 50.

However, when the distance L is increased too greatly, other problems might arise. While it is desirable that the X directions of the light emitting element groups 40 and 140 and the photosensitive drum 5 are parallel to each other, since it is difficult to always eliminate assembling errors, there is a possibility that an angle Θ between the X directions of the light emitting element groups 40 and 140 and the photosensitive drum 5 is generated by the assembling errors. When the assembling errors are within 0.1 mm and lengths of the light emitting element groups 40 and 140 in the X direction are 340 mm, an equation 2 is derived.

$$\tan \theta = 0.1 \times 2/340 \tag{Equation 2}$$

Figure 8:
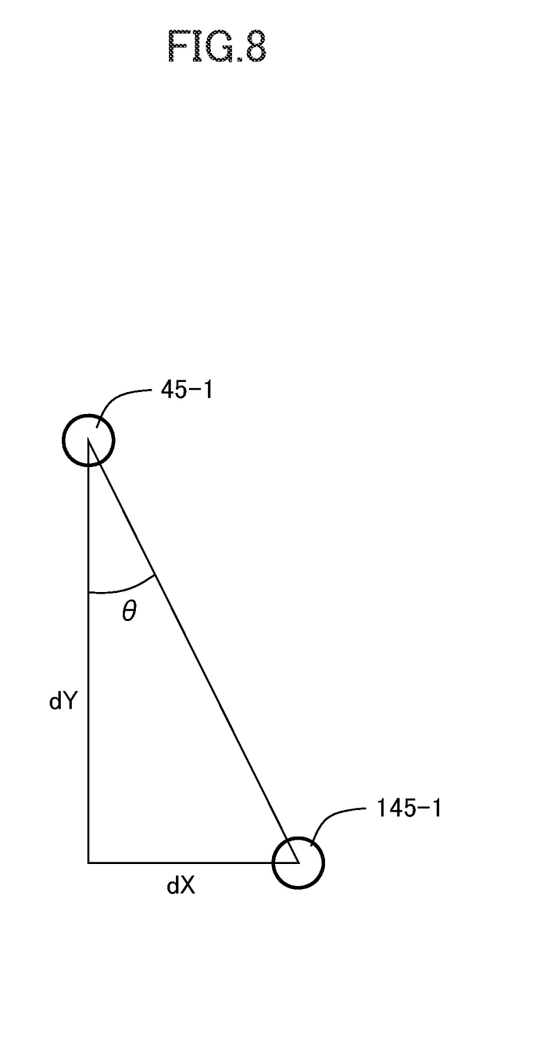
FIG. 8 is a plan view showing positions of the first and second light emitting elements relating to the embodiment.

Here, how much the image forming position is displaced in the X direction when an angle between the light emitting elements, which are, in design, positioned at the same X-direction position and farthest to each other in the Y direction, is Θ is calculated. For example, since the light emitting elements positioned in the same X-direction position and farthest to each other in the design are the first and second light emitting elements 45-1 acid 145-1 in FIG. 5, only these light emitting elements 45-1 and 145-1 are extracted, and a positional relationship at the time of the angle Θ is shown in FIG. 8. Given that distances in the Y and X directions between the light emitting elements 454 and 145-1 are respectively distances dY and dX, the relationship at the time of the angle Θ becomes a relationship expressed by an equation 3.

$$dX = dY \times \tan \theta \tag{Equation 3}$$

Here, since the positional displacement of the image is easily visually recognized if the positional displacement exceeds 5 μm, it is necessary to suppress the distance dX to equal to or less than 5 μm. Therefore, an equation 4 is derived from the equations 2 and 3.

$$dY \leq (340/(0.1 \times 2)) \times 0.005 = 8.5 \text{ (mm)} \quad \text{(Equation 4)}$$

In a case of this embodiment, as shown in FIG. 5, the distance between the light emitting elements 45-1 and 145-1 in design is the distance Y0, and becomes as shown in an equation 5. Therefore, the distance Y0 (pitch) between the first and second light emitting element groups 40 and 140 is preferably equal to or less than 8.5 mm.

$$Y0 \leq 8.5 \text{ (mm)} \quad \text{(Equation 5)}$$

Further, since L=Y0−W/2 and W=240 μm as described above, the distance L is preferably equal to or less than 8.38 mm. Therefore, a preferable range of the distance L becomes equal to or more than 0.7 mm and equal to or less than 8.38 mm. That is, the first light emitting element 45-1 and the second light emitting element 145-1, disposed so as to expose the same position on the surface of the photosensitive drum 5 as the relevant first light emitting element 45-1, are disposed such that the distance in the X direction between the first and second light emitting elements 45-1 and 145-1 becomes equal to or less than 5 μm.

As described above, the image forming apparatus 1 of this embodiment includes the rod lens arrays 50 and 150 respectively corresponding to the two rows of the light emitting element boards 41 and 141. By disposing, in the Y direction, the plurality of light emitting element groups in each of which the plurality of light emitting bodies are disposed in the Y direction, it is possible to perform the multiple exposure by using the plurality of light emitting elements in the Y direction, and possible to decrease the light amount required for the exposure with respect to the light emitting element. Therefore, it is possible to be applied to the image forming apparatus 1 having higher productivity. Further, by disposing the rod lens arrays respectively corresponding to the light emitting element groups, and by disposing the light emitting element groups and the rod lens arrays such that the centers of the light emitting element groups in the Y direction face the centers of the rod lens arrays in the Y direction, it is possible to efficiently guide the light from the light emitting element groups to the rod lens arrays. Therefore, it is possible to be applied to the image forming apparatus 1 having further higher productivity. As described above, by the image forming apparatus 1 of this embodiment, by performing the multiple exposure with a use of each of the light emitting element groups 40 and 140, it is possible to obtain the exposure head 30 capable of securing the light amount applicable to high productivity without impairing the image quality. Therefore, it is possible to increase the light amount and achieve a higher output in comparison with a case where only a single row of the light emitting element group is disposed.

To be noted, while, in the embodiment described above, the organic EL element is used as the light source of each of the light emitting element groups 40 and 140, it is not limited to this, and acceptable to use a gallium arsenide light-emitting diode (LED).

By this embodiment, it is possible to achieve the higher output.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-201843, filed Dec. 13, 2021, which is hereby incorporated by reference herein in its entirety.

What is claimed is:

1. An exposure head configured to form an electrostatic latent image by exposing a charged surface of an image bearing member that is movable in a first direction, the exposure head comprising:
    a first light emitting board group disposing a plurality of first light emitting boards each including a plurality of first light emitting elements disposed side by side in a second direction intersecting with the first direction, the plurality of first light emitting boards being disposed along the second direction and alternately in the first direction;
    a first lens array configured to condense light emitted from the plurality of first light emitting elements disposed on the first light emitting board group onto the surface of the image bearing member;
    a second light emitting board group disposing a plurality of second light emitting boards each including a plurality of second light emitting elements disposed side by side in the second direction, the plurality of second light emitting boards being disposed along the second direction and alternately in the first direction, the second light emitting board group being disposed in a manner separated with respect to the first light emitting board group in the first direction; and
    a second lens array configured to condense light emitted from the plurality of second light emitting elements disposed on the second light emitting board group onto the surface of the image bearing member,
    wherein the plurality of first light emitting elements and the plurality of second light emitting elements are organic electroluminescence elements.

2. The exposure head according to claim 1, wherein the plurality of first light emitting elements are disposed side by side in the first direction and the second direction, and
    wherein the plurality of second light emitting elements are disposed side by side in the first direction and the second direction.

3. The exposure head according to claim 2, wherein the plurality of first light emitting elements form a plurality of first groups in each of which a predetermined number of the first light emitting elements are disposed linearly,
    wherein the plurality of first groups disposed linearly are disposed such that longitudinal directions of the plurality of first groups are inclined to the first direction and the second direction and parallel to each other,
    wherein the plurality of second light emitting elements form a plurality of second groups in each of which a predetermined number of the second light emitting elements are disposed linearly, and
    wherein the plurality of second groups are disposed such that longitudinal directions of the plurality of second groups disposed linearly are inclined to the first direction and the second direction and parallel to each other.

4. The exposure head according to claim 1, wherein a distance in the first direction between the first light emitting board group and the second lens array is set such that a light amount entering into the second lens array is a light amount of equal to or less than 20% of a light amount emitted from the plurality of first light emitting elements, and
    wherein a distance in the first direction between the second light emitting board group and the first lens array is set such that a light amount entering into the first lens array is a light amount of equal to or less than 20% of a light amount emitted from the plurality of second light emitting elements.

5. An image forming apparatus comprising:
an image bearing member;
a charge unit configured to charge a surface of the image bearing member;
the exposure head according to claim 1;
a developing unit configured to develop an electrostatic latent image formed on the surface of the image bearing member by the exposure head with developer; and
a transfer unit configured to transfer the developed image onto a recording material.

* * * * *